United States Patent
Wei (10) Patent No.: US 7,743,820 B2
(45) Date of Patent: Jun. 29, 2010

(54) LIQUID COOLING UNIT WITH AUXILLARY HEAT EXCHANGER AND AUXILLARY PUMP

(75) Inventor: Jie Wei, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 718 days.

(21) Appl. No.: 11/270,517

(22) Filed: Nov. 10, 2005

(65) Prior Publication Data

US 2006/0289148 A1     Dec. 28, 2006

(30) Foreign Application Priority Data

Jun. 24, 2005     (JP)     ............................. 2005-184326

(51) Int. Cl.
*F28D 15/00*     (2006.01)
*F25B 29/00*     (2006.01)
*F28F 27/02*     (2006.01)

(52) U.S. Cl. .................. 165/104.31; 165/100; 165/259; 165/260; 165/261; 165/262

(58) Field of Classification Search ............ 165/104.31, 165/259, 260, 261, 262, 100
See application file for complete search history.

(56) References Cited

U.S. PATENT DOCUMENTS

| 4,004,573 | A | * | 1/1977 | Frieling et al. | ............... | 126/615 |
| 4,129,179 | A | * | 12/1978 | Molitor | ....................... | 165/101 |
| 4,173,994 | A | * | 11/1979 | Hiser | ......................... | 165/48.2 |
| 4,299,277 | A | * | 11/1981 | McGregor | ................... | 165/48.2 |
| 4,865,123 | A | * | 9/1989 | Kawashima et al. | ... | 165/104.33 |
| 5,348,076 | A | * | 9/1994 | Asakawa | ..................... | 165/282 |
| 6,371,157 | B1 | * | 4/2002 | See et al. | ................. | 137/565.22 |
| 2003/0159808 | A1 | * | 8/2003 | Hoang | .................... | 165/104.26 |
| 2009/0321533 | A1 | * | 12/2009 | Bigler et al. | ............. | 237/12.3 B |

FOREIGN PATENT DOCUMENTS

| JP | 61023440 | A |   | 1/1986 |
| JP | 02204809 | A |   | 8/1990 |
| JP | 09015379 | A | * | 1/1997 |
| JP | 2004257627 | A | * | 9/2004 |
| SU | 1548624 | A | * | 3/1990 |

OTHER PUBLICATIONS

Translation of SU1548624 A1, pp. 1-11.*

* cited by examiner

*Primary Examiner*—Cheryl J Tyler
*Assistant Examiner*—Brandon M Rosati
(74) *Attorney, Agent, or Firm*—Arent Fox LLP (57) ABSTRACT

The circulation main loop supplies the liquid coolant by means of the main pump to the cooling plate which cools the electronic element, and then, dissipates the heat by the main heat exchanger 20 to return the same to the reservoir tank. The circulation sub-loop supplies the liquid coolant by means of the sub-pump, and after dissipating the heat by the sub-heat exchanger, returns the same to the refrigerant tank. The controller controls as required the supply flow rate from the main pump and the sub-pump.

3 Claims, 8 Drawing Sheets

LIQUID COOLING UNIT WITH AUXILLARY HEAT EXCHANGER AND AUXILLARY PUMP

This application is a priority based on prior application No. JP2005-184326, filed Jun. 24, 2005, in Japan.

BACKGROUND OF THE INVENTION

1. Field of the Invention

The present invention relates to a liquid cooling unit for electronic systems, which cools electronic elements such as a LSI processor by means of a forced circulation of liquid coolant. More particularly, the invention relates to a liquid cooling unit for electronic devices which improves the cooling efficiency without increasing an amount of the liquid circulation to a cooling plate on which an electronic device is installed.

2. Description of the Related Art

In a typical server system, a plurality of server units are mounted in a rack. The amount of generated heat from LSI processors used in servers has largely increased along with improvements of the processor transmission frequency. There is therefore a shortage of cooling capacity for the conventional forced air cooling in a spatially limited server enclosure, while the liquid cooling has a potential advantage of higher cooling capability.

Figure 1:
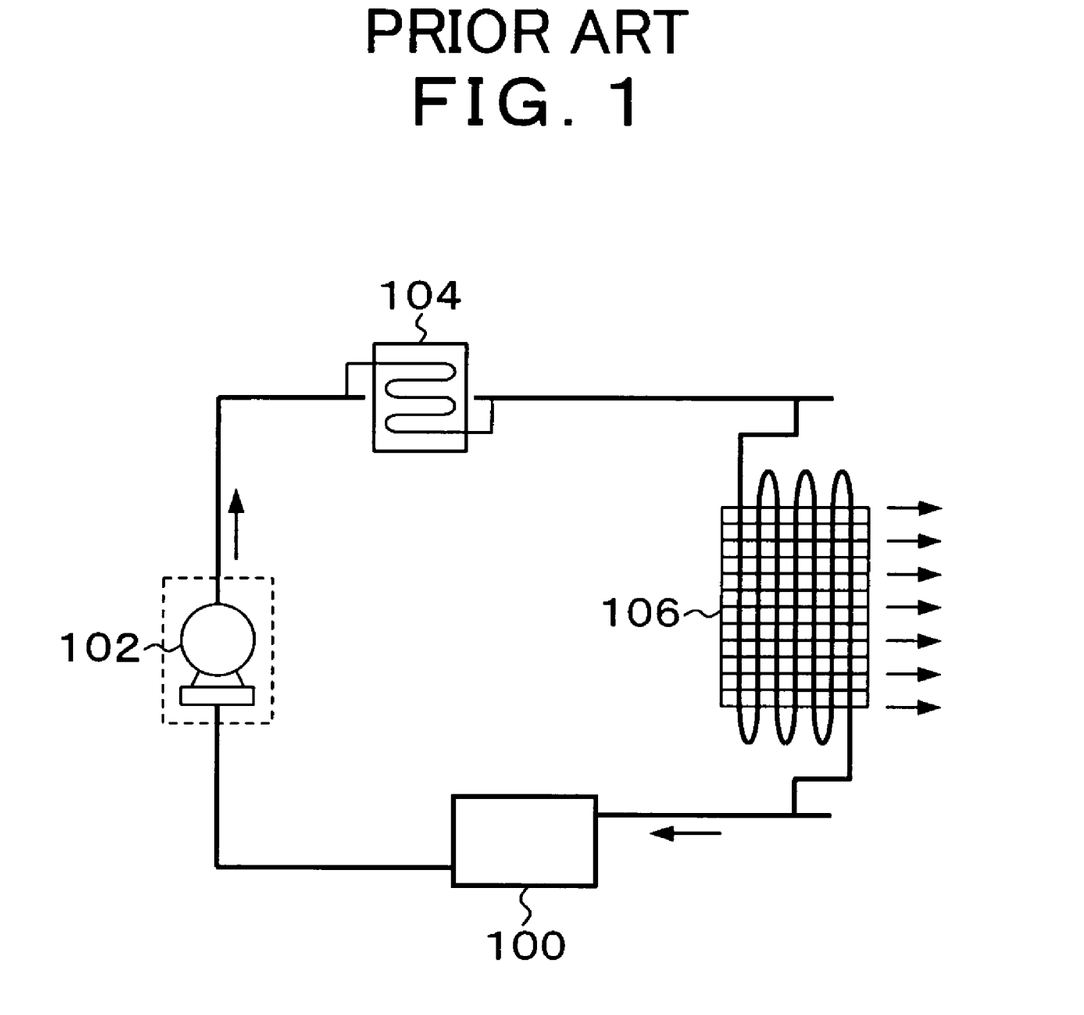
FIG. 1 is a descriptive view of a conventional cooling system.

FIG. 1 is a descriptive view of a conventional liquid cooling system used for electronics cooling. In FIG. 1, the circulation loop is formed so that the liquid coolant is pressure-supplied by the pump 102, and after flowing through the cooling plate 104 which cools electronic elements, heat of the coolant is dissipated by the heat exchanger 106 and the coolant is returned to the reservoir tank 100.

More specifically, the liquid coolant is pressure-supplied by the pump 102 to the cooling plate 104. An electronic element such as a LSI processor is mounted on the cooling plate 104, and is cooled indirectly by forced circulation of the liquid coolant. The high-temperature coolant leaving the cooling plate 104 enters the air-cooled heat exchanger 106, and after being cooled to a temperature near the ambient temperature by outside air convection, the coolant is returned to the reservoir tank 100, and these steps are repeated.

Figure 2A:
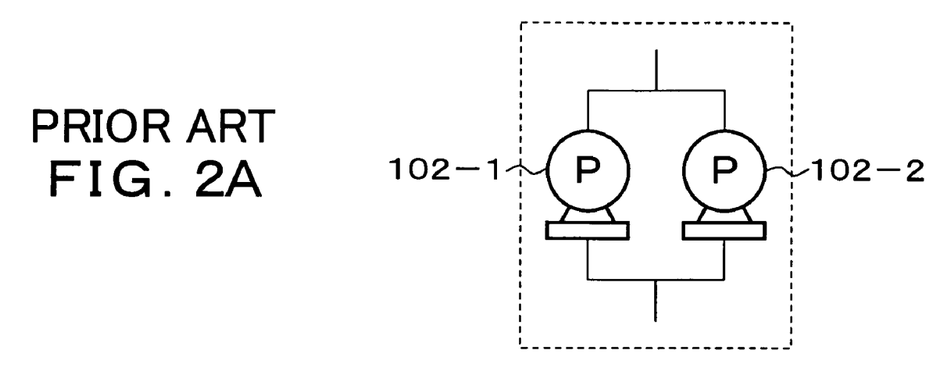
FIGS. 2A and 2B are descriptive views when using two pumps in the conventional system.
Figure 2B:
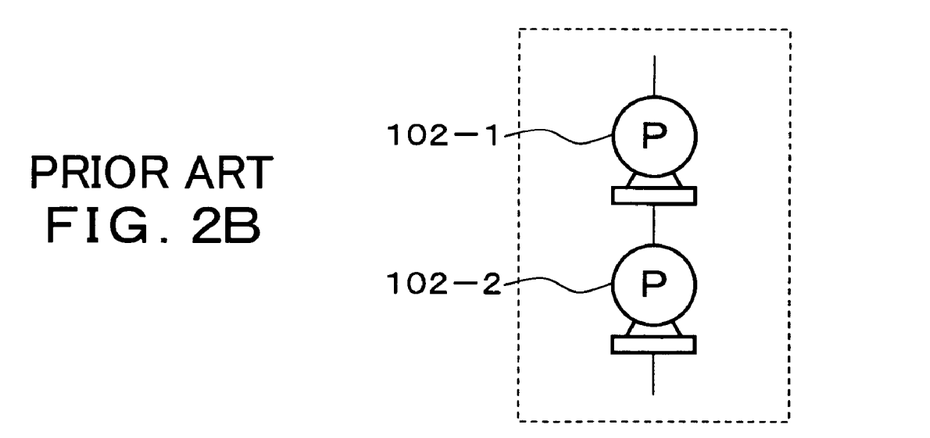

For achieving a higher cooling ability of a liquid cooling system, it is an usual practice to connect two pumps 102-1 and 102-2 in parallel as shown in FIG. 2A, or connect the pumps 102-1 and 102-2 in series as shown in FIG. 2B, thereby increasing the flow rate of the liquid coolant passing through the cooling plate 104.

Figure 3:
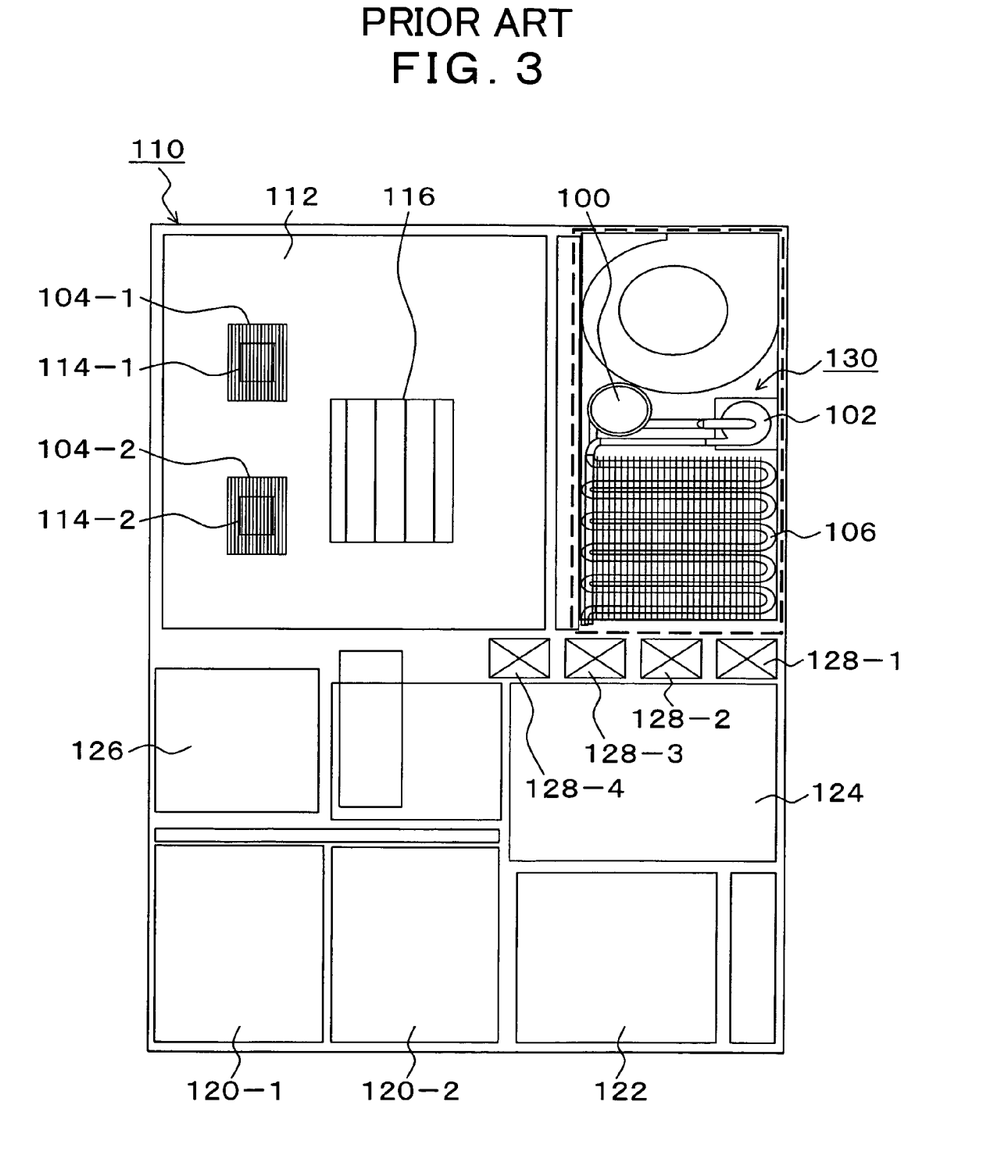
FIG. 3 is a descriptive view of a server enclosure in which a conventional liquid cooling unit is installed.

FIG. 3 is a descriptive view in which the conventional liquid cooling system as shown in FIG. 1 is incorporated into a server enclosure. In FIG. 3, a system board 112 is provided in the server enclosure 110, and LSI processors 114-1 and 114-2 and memory cards as well as other components 116 are packaged on the system board 112. The cooling plates 104-1 and 104-2 are mounted on the processors 114-1 and 114-2, respectively.

The server enclosure also incorporates hard disk drives 120-1 and 120-2, a CD-ROM driver 122, a power supply unit 124, a blower fan 126, and air fans 128-1 to 128-4.

A liquid cooling unit 130 is arranged adjacent the system board 110, has a coolant reservoir tank 100, a pump 102, a heat exchanger 106, and a blower fan 132. The liquid cooling unit 130 includes piping from the pump 102 to the cooling plates 104-1 and 104-2 that mounted on the processors 114-1 and 114-2, the liquid coolant returns to the heat exchanger 106, then thus to the reservoir tank 100.

In such a conventional liquid cooling system for electronic devices, however, there is a demand for high-performance and compact in order to achieve a high density packaging of electronic devices such as a server, particularly achievement of a thinner enclosure. The cooling performance largely depends upon a heat dissipation capability of the heat exchanger, reducing the size of the heat exchanger may have a problem resulting in a decreasing of cooling ability.

The cooling plate mounted on the electronic device, in which the coolant flows through thin or narrow channels will suffer from a large pressure loss. Thus, a flowrate of the liquid coolant through the heat exchanger is considerably reduced, limiting the cooling ability seriously.

SUMMARY OF THE INVENTION

According to the present invention, a liquid cooling unit is proposed for electronic devices, which has a high cooling efficiency, compact package and effective cost performance.

The present invention provides a liquid cooling unit for electronic devices, comprising a reservoir tank which stores liquid coolant; a main pump which circulates the liquid coolant; a cooling plate which cools electronic elements by internal liquid forced convection; and a main heat exchanger which dissipates heat from the liquid coolant released from the cooling plate, the coolant then returns to the reservoir tank; wherein a sub-pump is provided that circulates the liquid coolant; and an auxiliary heat exchanger which dissipates heat from the liquid coolant supplied by the sub-pump, and the coolant returns to the reservoir tank.

In an embodiment, a coolant-circulation/heat-dissipation main loop is formed through a route in which, after supplying the liquid coolant by the main pump to the cooling plate which cools electronic elements, heat is dissipated by means of the main heat exchanger, and the coolant is returned to the reservoir tank; and wherein a circulation/dissipation sub-loop is formed through a route in which, after dissipating heat through the auxiliary heat exchanger by the liquid coolant circulation by means of the sub-pump, the coolant is returned to the reservoir tank.

In another embodiment of the present invention, there is provided a liquid cooling unit for electronic devices, comprising a reservoir tank which stores liquid coolant; a main pump which circulates the liquid coolant; a cooling plate which cools electronic elements by the liquid coolant forced convection by the main pump; and a main heat exchanger which, after dissipating the heat from the liquid coolant from the cooling plate, returns to the reservoir tank; wherein there is provide a sub-pump which, after dissipating the heat by forced convection of the liquid coolant in the heat exchanger, returns the same to the reservoir tank.

In still another embodiment of the present invention, a circulation/dissipation main loop is formed through a route in which, after supplying the liquid coolant by the main pump to the cooling plate which cools electron elements, heat is dissipated through the heat exchanger, and the coolant is returned to the reservoir tank; and wherein a circulation/ dissipation sub-loop is formed through a route in which, after dissipating the heat through the heat exchanger by forced convection of the liquid coolant by the sub-pump, the coolant is returned to the reservoir tank.

In further another embodiment of the liquid cooling unit for electronic devices of the present invention, a flow rate control unit for individually controlling the flow rate by the main pump and the sub-pump is provided so as to ensure a constant flow rate of the heat exchanger.

According to the present invention, in addition to the circulation/dissipation main loop which, after circulating the liquid coolant from the reservoir tank by the main pump and sending the same through the cooling plate on the electronic device, heat dissipated thereof in the main heat exchanger and returns the same to the reservoir tank, there is provided a circulation/dissipation sub-loop which, after dissipating heat of the liquid coolant from the reservoir tank by circulating the same from the sub-pump to the auxiliary heat exchanger, returns the same to the reservoir tank. As a result, the liquid coolant is cooled by the circulation/dissipation sub-loop. It is thus possible to keep a low temperature of the coolant supplied through the circulation/dissipation main loop to the cooling plate always near the ambient temperature, thereby making it possible to increase the cooling efficiency of the electronic device even with a more compact heat exchanger.

By the division of the heat exchanger into a main heat exchanger and a sub-heat exchanger, the flow rate of the main pump and the sub-pump may be, for example, a half that in the case of a single pump, thus permitting downsizing and cost reduction of the pumps. The separation of the heat exchanger into the main heat exchanger and the sub-heat exchanger leads to a higher degree of flexibility for the arrangement of the electronic devices within the enclosure, permitting saving of the installation space, thus enabling to achieve a more compact and thinner packaging.

A cooling plate using a thin piping or narrow channels leading to a large pressure loss is not provided in the sub-loop circultion by the sub-pump. This makes it possible to supply the coolant in a sufficient quantity to the sub-heat exchanger, to reduce the temperature of the liquid coolant to be returned to the reservoir tank sufficiently, and to improve the cooling efficiency of the circulation/dissipation main loop.

The above and other objects, features, and advantages of the present invention will become more apparent from the following detailed description with reference to the drawings.

DETAILED DESCRIPTION OF THE PREFERRED EMBODIMENTS

Figure 4:
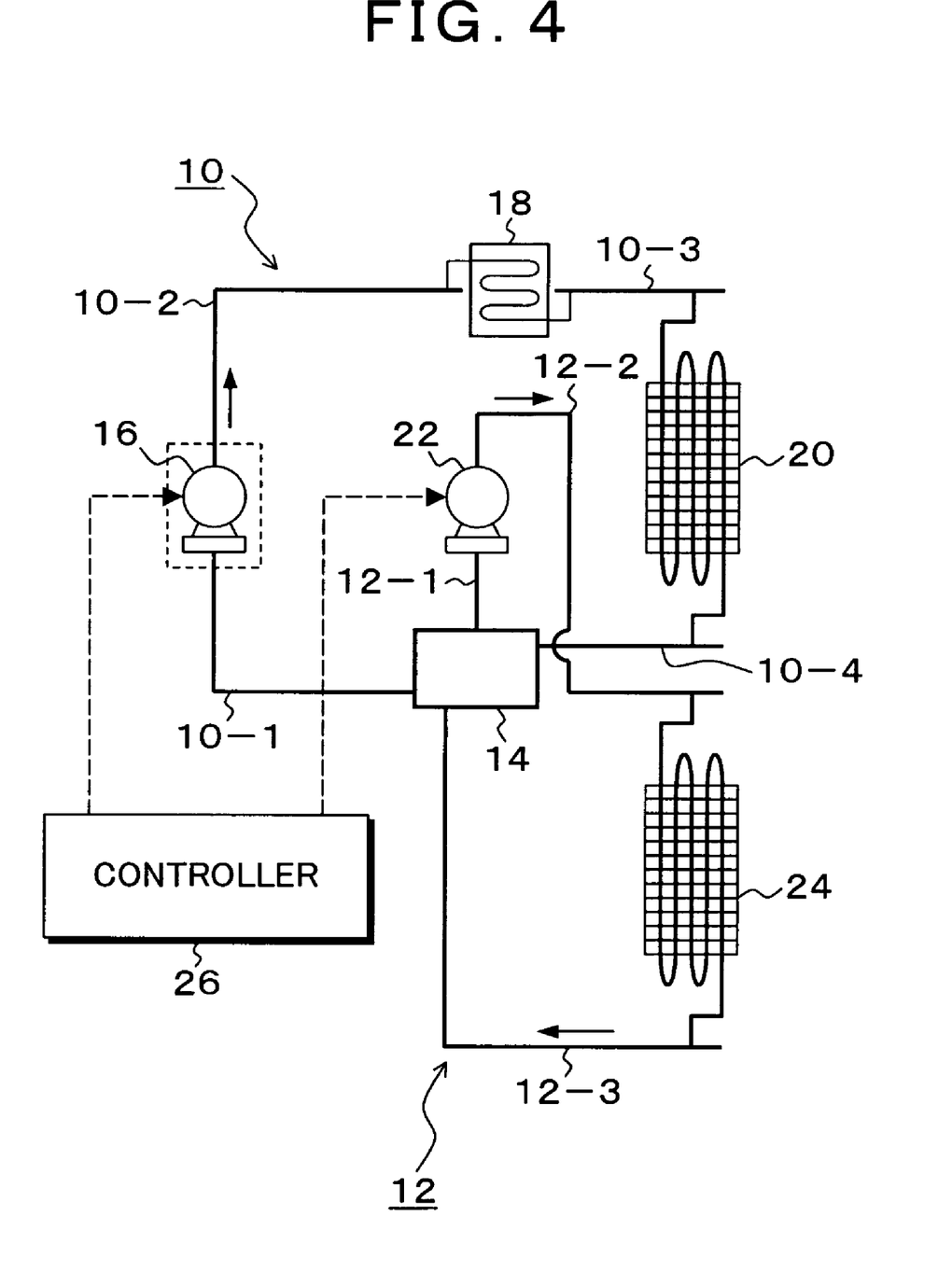
FIG. 4 is a descriptive view of a first embodiment of the liquid cooling unit of the present invention.

FIG. 4 is a descriptive view of a first embodiment of the liquid cooling unit of the present invention. In FIG. 4, the liquid cooling unit of the present invention comprises a circulation/dissipation main loop 10 and a circulation/dissipation sub-loop 12. A reservoir tank 14, a main pump 16, a cooling plate 18 and a main heat exchanger 20 are provided in the circulation/dissipation main loop 10. The reservoir tank 14 is connected to the inlet of the main pump 16 via a piping 10-1 and the coolant is circulated to the cooling plate 18 via a piping 10-2. The outlet of the cooling plate 18 is connected to the main heat exchanger 20 via a piping 10-3, and the liquid coolant dissipates the heat through the main heat exchanger 20 then returns to the reservoir tank 14 through a piping 10-4. On the other hand, the reservoir tank 14, the sub-pump 22 and the sub-heat exchanger 24 are provided in the circulation/dissipation sub-loop 12. More specifically, the reservoir tank 14 is connected to the sub-pump 22 by a piping 112-1. The liquid coolant circulated by the sub-pump 22 is supplied to the sub-heat exchanger 24 through a piping 12-2, and after dissipates the heat in the sub-heat exchanger 24, returns to the reservoir tank 14 through a piping 12-3. Therefore, the main loop 10 and the sub-loop 12 are arranged in parallel as two independent loops relatively to the reservoir tank 14. If the coolant flow rate from the main pump 16 is assumed to be Q1, and the coolant flow rate of the sub-pump 22, to be Q2, when the liquid cooling system of the present invention is incorporated in a general server enclosure, for example, the same pump flow rates of Q1=about 600 cc/minute and Q2=about 600 cc/minute are set as the liquid coolant flow rate. A controller 26 is provided for the main pump 16 and the sub-pump 22, so that the coolant flow rates Q1 and Q2 can be variably controlled by changing the motor revolutions of the main pump 16 and the sub-pump 22 as required, in addition to the startup control and stoppage control of the motors provided for the main pump 16 and the sub-pump 22. For example, the coolant flow rate of the main pump 16 is fixed at Q1=about 600 cc/minute, while the coolant flow rate Q2 of the sub-pump 22 is variably controlled by detecting the temperature of the liquid coolant in the reservoir tank 14. For example, when the temperature of the liquid coolant in the reservoir tank 14 increases and exceeds the threshold temperature, the flow rate Q2 of the sub-pump 22 of a prescribed value of 600 cc/minute is increased by a prescribed amount, and the amount of heat dissipation by the sub-heat exchanger 24 is increased, thereby reducing the temperature. When the coolant temperature of the reservoir tank 14 becomes lower than the threshold temperature, the flow rate of the sub-pump 22 is decreased from the prescribed value of 600 cc/minute by a prescribed amount to reduce the amount of heat dissipation based on the sub-heat exchanger 24, thereby inhibiting unnecessary increase in the amount of discharge from the sub-pump 22 over the necessity.

Figure 5:
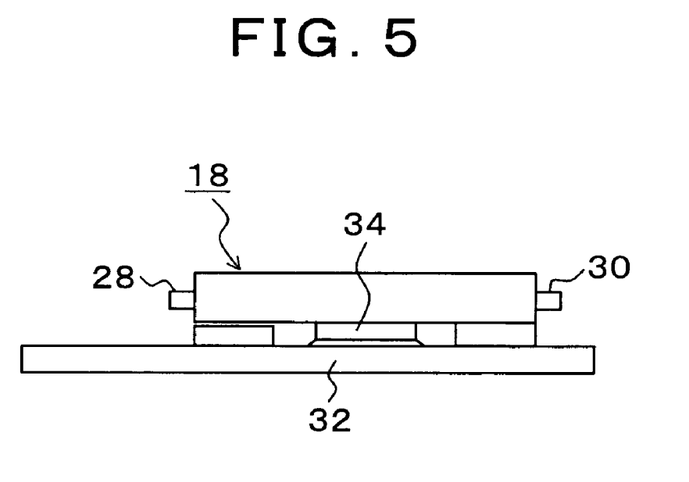
FIG. 5 is a descriptive view of the cooling plate shown in FIG. 4.

FIG. 5 is a descriptive view of the cooling plate 18 shown in FIG. 4. In FIG. 5, the cooling plate 18 is installed and secured, in contact with, to the upper portion of the LSI processor 34 mounted on the system board 32 as a heat sink thereof. The liquid coolant supplied through piping connection to the inlet is supplied into the piping running through the cooling plate 18 so as to absorb heat generated in the processor 34 and discharge the liquid coolant having an elevated temperature from the outlet 30.

Figure 6:
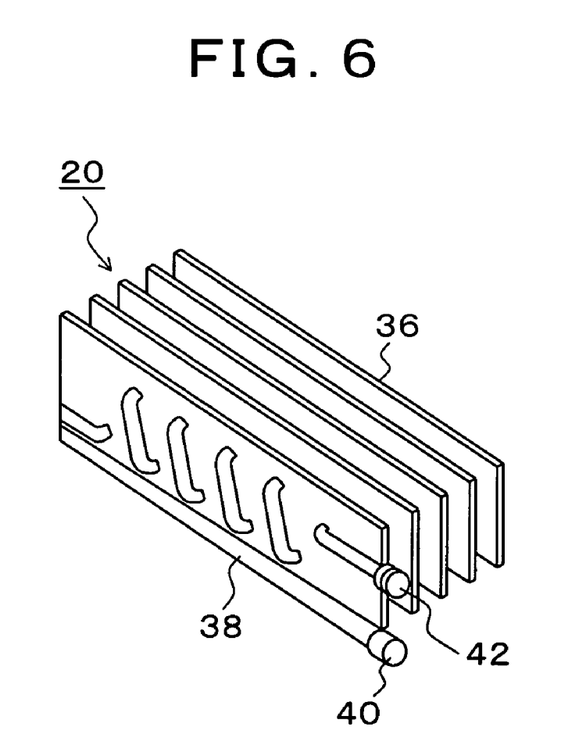
FIG. 6 is a descriptive view of the main heat exchanger shown in FIG. 4.

FIG. 6 is a descriptive view of the main heat exchanger shown in FIG. 4. In FIG. 6, the main heat exchanger 20 has a radiation pipe 38 crossing a plurality of arranged fins in a direction which crosses the fins 36 repeatedly. An inlet 40 supplying the liquid coolant opens at an end of the radiation pipe 38, and the opposite side, an outlet 42 for taking out the liquid coolant opens. This structure of the main heat exchanger 20 is the same for the sub-heat exchanger 24 shown in FIG. 4. The main heat exchanger 24 have the same size and radiation capacities.

Figure 7:
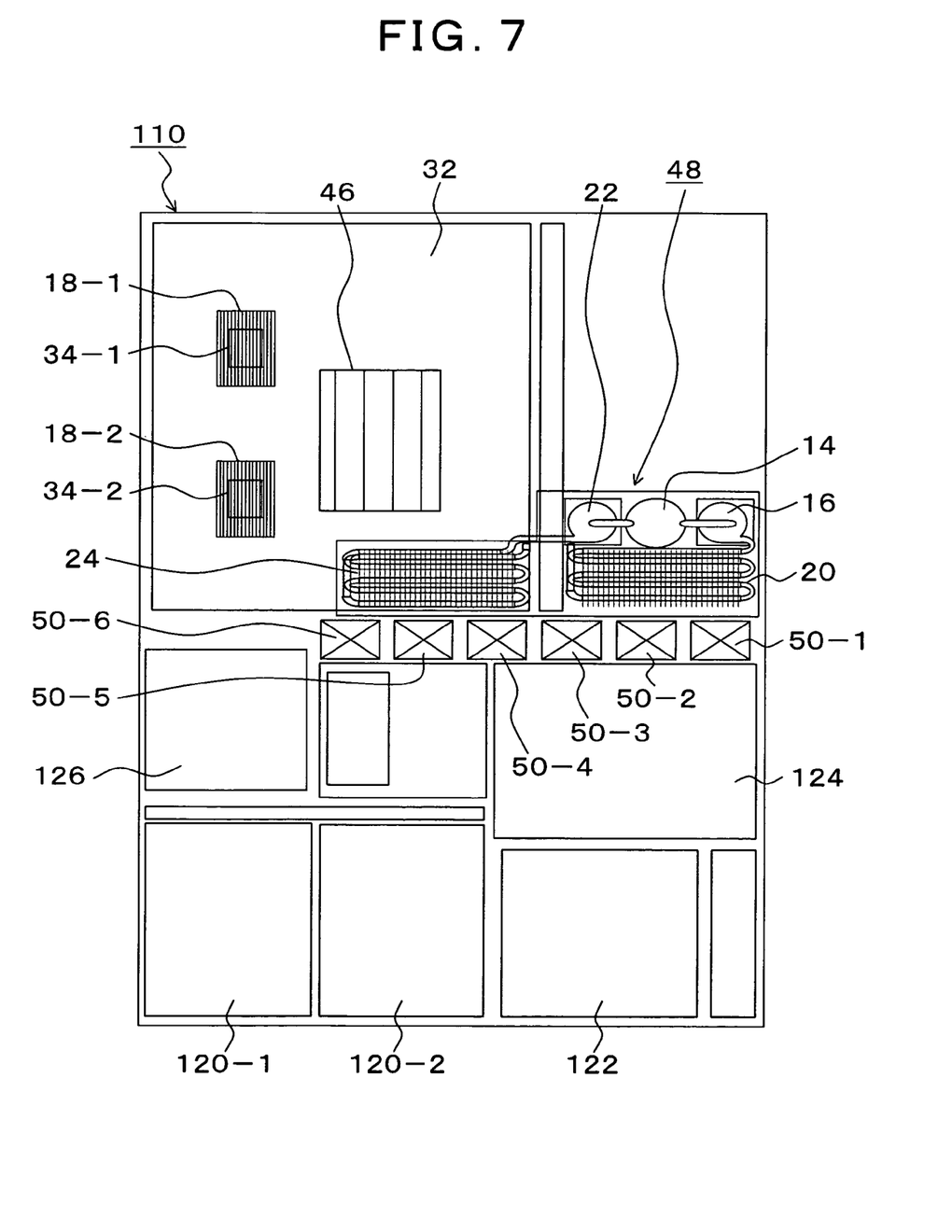
FIG. 7 is a descriptive view of the server enclosure in which the liquid cooling unit shown in FIG. 4 is installed.

FIG. 7 is a descriptive view of the liquid cooling unit of the present invention shown in FIG. 4 incorporated in a server enclosure. In FIG. 7, the server enclosure 110 is identical with that in the conventional case shown in FIGS. 2A and 2B. The system board 32 to be cooled by the liquid cooling system of the present invention is incorporated in the server enclosure 110, and in addition thereto, as in the conventional case, hard disk drives 120-1 and 120-2, a CD-ROM drive 122, a power supply unit 124, and a blower fan 126 are incorporated. Memory cards 46 and processors 34-1 and 34-2 are mounted on the system board 32. Cooling plates 18-1 and 18-2 provided in the circulation main loop shown in FIG. 4 are mounted as shown in FIG. 5 on the processors 34-1 and 34-2. The liquid cooling unit 48 of the present invention is arranged adjacent the system board 32. The main pump 16 and the sub-pump 22 are arranged on both sides of the reservoir tank 14. The piping from the main pump 16 is connected to the main heat exchanger 20, and the piping from the sub-pump 22 is connected to the sub-heat exchanger 24. The outlet of the main heat exchanger 20 is connected through a piping not shown to the inlet of the cooling plate 18-1 on the system board 32, piping-connects the outlet side of the cooling plate 18-1 to the inlet side of the cooling plate 18-2, and returns the outlet side of the cooling plate 18-2 to the reservoir tank 14 via a piping not shown. Air fans 50-1 to 50-6 are arranged for the main heat exchanger 20 and the sub-heat exchanger 24 for forced air cooling. Comparison with the conventional system shown in FIG. 9 clarifies that the four air fans 50-1 to 50-4 on the main heat exchanger 20 side are the same as the air fans 128-1 to 128-4 shown in FIG. 8, and in the present invention, two air fans 50-5 and 50-6 are added to cope with the provision of the sub-heat exchanger 24.

However, while the conventional system shown in FIG. 3 requires a blower fan 132 for applying forced air cooling of the heat exchanger 106 adjacent the liquid cooling system, in the present invention, the heat exchanger is divided into a main heat exchanger 20 and a sub-heat exchanger 24, and air fans 50-1 to 10-6 are provided for the separated heat exchangers, thus eliminating the necessity of the blower fan 132 performing forced air cooling of the heat exchanger 106 in the conventional system. As a result, in the liquid cooling unit of the present invention, separation of the heat exchanger into the main heat exchanger 20 and the sub-heat exchanger 24 brings about an increase in the degree of flexibility upon installing within an enclosure and makes it possible to achieve a largely more compact packaging of the entire system including the air fans for forced air cooling. In addition to the circulation main loop 10 comprising, as shown in FIG. 4, the reservoir tank 14, the main pump 16, the cooling plate 18, and the main heat exchanger 20, the sub-loop 12 comprising the reservoir tank 14, and the sub-heat exchanger 24 is separately provided in the liquid cooling unit 48 of the present invention. As a result, even when the temperature of the liquid coolant returned after heated on the cooling plate 18 and then dissipated in the main heat exchanger 20 increases in the reservoir tank 14, the liquid coolant is sent by the circulation sub-loop 12 from the sub-pump 22 to the sub-heat exchanger 24 and cooled, thus resulting in a sufficiently lower temperature. The temperature of the liquid coolant in the reservoir tank 14 is always reduced to a temperature substantially equal to the service temperature always in the service environment. This makes it possible to maintain a high cooling efficiency in the circulation main loop 10, and to achieve an improved cooling performance of the liquid cooling system and a more compact of the entire system. In the circulation sub-loop 12, the coolant supplied from the sub-pump 22 never passes through a cooling plate 18 causing a high pressure loss such as the circulation main loop 10, but is directly supplied to the sub-heat exchanger 24. Since this leads to a lower pressure loss, it is possible to ensure a sufficient circulation flow rate of the coolant, thus leading to a considerable improvement of the cooling efficiency and performance of the liquid coolant in the sub-heat exchanger 24.

Figure 8:
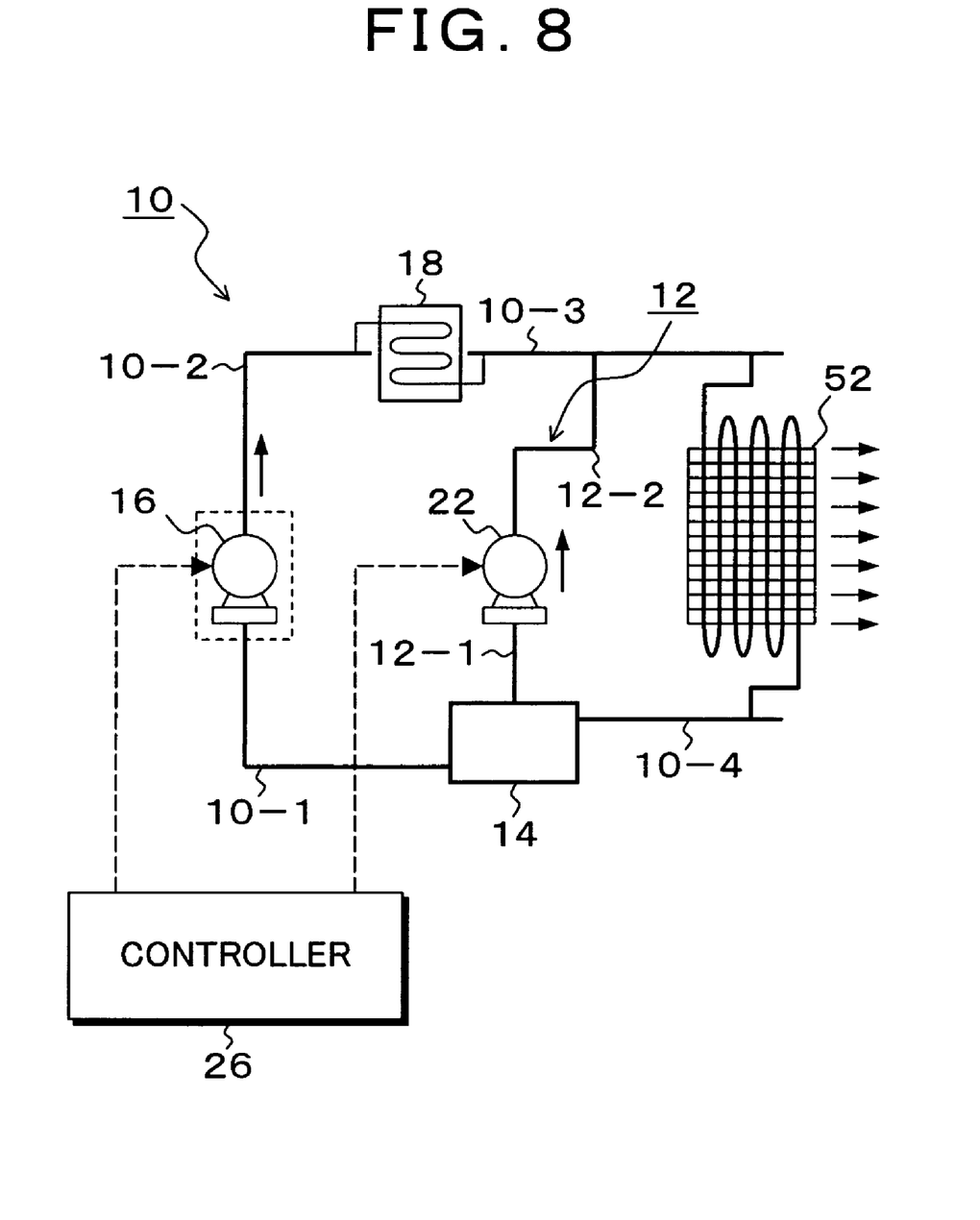
FIG. 8 is a descriptive view of a second embodiment of the liquid cooling unit of the present invention.

FIG. 8 is a descriptive view illustrating a second embodiment of the liquid cooling unit of the present invention. In FIG. 8, the liquid cooling unit of the second embodiment comprises a circulation main loop 10 having a reservoir tank 14, a main pump 16, a cooling plate 18 and a heat exchanger 52, and in addition thereto, a circulation sub-loop 12 comprising a reservoir tank 14, a sub-pump 22 and a heat exchanger 52 is provided. The circulation sub-loop 12 connects, by means of the piping 12-1, the reservoir tank 14 to the inlet of the pump 22, and then, connects the discharge side of the sub-pump 22 to the middle of the piping 10-3 from the cooling plate 18, i.e., to the inlet side of the heat exchanger 50. This allows supply of the liquid coolant supplied from the sub-pump 22 to the heat exchanger 52 without passing through the portion of a high pressure loss of the cooling plate 18. A controller 54 is provided for the main pump 16 and the sub-pump 22. If the heat exchanger 52 has an allowable flow rate Q, the pump flow rate Q1 of the main pump 16 and the pump flow rate Q2 of the sub-pump 22 are set so as to satisfy:

$$Q=Q1+Q2$$

Basically, the two pump flow rates may have a relationship: $Q1=Q2$. For example, $Q1=Q2=$about 600 cc/minute may be set. On the assumption of an operating scheme comprising pump flow rates Q1 and Q2 in terms of the shape as described above, for example when the temperature of the liquid coolant in the reservoir tank 14 is monitored by a sensor, and the liquid coolant temperature exceeds a prescribed threshold temperature, the pump flow rate Q2 is increased by increasing the motor revolutions of the sub-pump 22, and it is possible to control so as to reduce the coolant temperature by increasing the coolant flow rate through the heat exchanger 50. Increasing the pump flow rate Q2 of the sub-pump 22 leads to an increase in the outlet pressure on the piping 10-3 side of the cooling plate 18, this substantially resulting in a decrease in the pump flow rate Q1 caused by the main pump 16. Since the coolant temperature can be reduced by the increase in the pump flow rate Q2 of the sub-pump 22, however, even when the pump flow rate Q1 of the main pump 16 decreases, the decrease in temperature of the liquid coolant causes almost no change in the cooling efficiency in the cooling plate 18. An advantage of the second embodiment shown in FIG. 8 is that simple addition of a sub-pump 22 to the piping lines 12-1 and 12-2 permits easy forming of a circulation sub-loop 12 for the conventional system shown in FIG. 1. When the circulation sub-loop 12 is provided by adding the sub-pump 22, as compared with the conventional system having a single pump, the flow rate of the main pump 16 may be set for example at half the pump flow rate. It is as a result possible to reduce the pump size, and to ensure a sufficient cost reduction even when installing two pumps.

Figure 9:
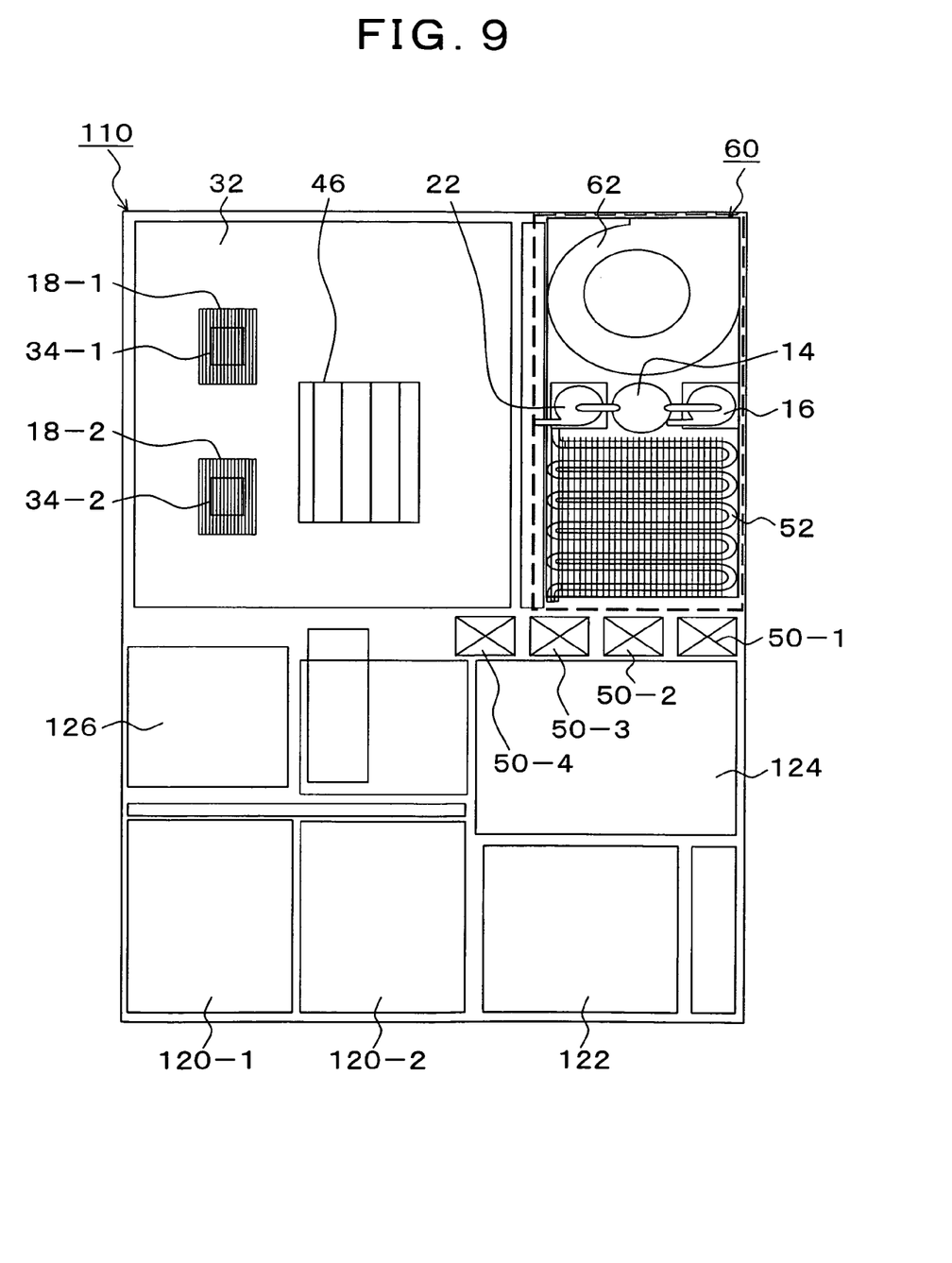
FIG. 9 is a descriptive view of the server enclosure in which the liquid cooling unit shown in FIG. 8 is arranged.

FIG. 9 is a layout descriptive view of the server enclosure 110 of the second embodiment shown in FIG. 8. In FIG. 9, the liquid cooling unit 60 of the present invention having the configuration of the second embodiment shown in FIG. 8 is arranged adjacent the system board 32, has a main pump 16, a sub-pump 22, and a heat exchanger 52.

Furthermore, a blower fan 62 and air fans 50-1 to 50-4 for forced air-cooling the heat exchanger 52 are arranged. The piping from the main pump 16 passes through the cooling plates 18-1 and 18-2 provided on the processors 34-1 and 34-2 mounted on the system board 32 to the heat exchanger 52, and returns to the reservoir tank 14 from the heat exchanger. On the other hand, the sub-pump 22 is piping-mounted so as to supply the coolant from the reservoir tank 14 directly to the inlet side of the heat exchanger 50.

The liquid cooling unit 60 of the second embodiment of the present invention occupies the same installation space as that of the conventional system shown in FIGS. 2A and 2B in the server enclosure 110.

However, as a result of addition of the circulation sub-loop 12 having the sub-pump 22, apart from the circulation main loop 10 on the main pump 16 side, the coolant temperature in the reservoir tank 14 can be always kept near the ambient temperature, thus enabling to sufficiently increase the cooling efficiency of the processors 34-1 and 34-2 by the cooling plates 18-1 and 18-2. The above-mentioned embodiments have covered cases where the liquid cooling unit is incorporated into the server enclosure. The present invention is not however limited to these cases, but the system can be similarly incorporated into an appropriate electronic device. The processor has been adopted as a component to be cooled. The system of the present invention is similarly applicable to other appropriate heat-generating device or a heat-generating element other than a processor.

The present invention includes appropriate variations without impairing the objects and advantages thereof, and is not limited by the numerical values shown in the above-mentioned embodiments.

What is claimed is:

1. A liquid cooling unit for an electronic device, comprising:
   a circulation/heat-dissipation main loop including:
   a reservoir tank storing a liquid coolant;
   a cooling plate provided on electric elements, and absorbs heat from the electric elements;
   a main pump circulating the liquid coolant of said reservoir tank into the cooling plate; and
   a main heat exchanger dissipating heat from the liquid coolant released from said cooling plate, and then returns the same to said reservoir tank;
   a circulation/dissipation sub-loop including:
   the reservoir tank;
   an auxiliary heat exchanger; and
   a sub-pump supplying the liquid coolant of said reservoir tank directly into the auxiliary heat exchanger, the auxiliary heat exchanger further dissipating heat from the liquid coolant and the returning the same to said reservoir tank,
   a controller configured to increase a flow rate of the sub-pump when the temperature of the liquid coolant in the reservoir tank exceeds a threshold temperature.

2. The liquid cooling unit according to claim 1, wherein the controller increases the flow rate of the sub-pump when the temperature of the liquid coolant in the resevoir tank exceeds the threshhold temperature.

3. The liquid cooling unit according to claim 1, wherein the controller decreases the flow rate of the sub-pump when the temperature of the liquid coolant in the reservoir tank falls below the threshold temperature.

* * * * *